(12) United States Patent
Gau et al.

(10) Patent No.: US 6,255,191 B1
(45) Date of Patent: Jul. 3, 2001

(54) METHOD OF FABRICATING AN ISOLATION STRUCTURE IN AN INTEGRATED CIRCUIT

(75) Inventors: Jing-Horng Gau, Nan-Tou Hsien; Hsiu-Wen Huang, Kaoshiung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/215,599

(22) Filed: Dec. 17, 1998

(30) Foreign Application Priority Data

Sep. 19, 1998 (TW) .................................. 87115640

(51) Int. Cl.$^7$ .................................. H01L 21/762
(52) U.S. Cl. .......................... 438/425; 438/444
(58) Field of Search .................... 438/425, 427, 438/439, 444, 445, 448, 424

(56) References Cited

U.S. PATENT DOCUMENTS 5,399,520 * 3/1995 Jang ..................................... 438/439
5,510,290 * 4/1996 Kwon .................................. 438/445
5,804,491 * 9/1998 Ahn ..................................... 438/425
6,020,230 * 2/2000 Wu ....................................... 438/445

\* cited by examiner

Primary Examiner—Olik Chaudhuri
Assistant Examiner—Anh Duy Mai
(74) Attorney, Agent, or Firm—Jiawei Huang; J.C. Patents

(57) ABSTRACT

A semiconductor fabrication method is provided for the fabrication of an isolation structure including a shallow-trench isolation (STI) structure in an integrated circuit. This method is characterized by the increase in the thickness of the adhesive layer over that of the prior art and also in the use of thermal oxidation process to form the STI structure. The thick adhesive layer can thus resist the stress from thermal expansion of the various component layers in the integrated circuit during heat treatment. Moreover, the resulting STI structure is not formed with recessed edge portions since the hydrofluoric (HF) etchant acts on the silicon dioxide plug in the STI structure with substantially the same etching rate as on the adhesive layer. Moreover, this method includes no chemical-mechanical polish (CMP) process, so the problem of scratches on the surface of the silicon dioxide plug as seen in the case of the prior art is avoided.

6 Claims, 5 Drawing Sheets

US 6,255,191 B1

METHOD OF FABRICATING AN ISOLATION STRUCTURE IN AN INTEGRATED CIRCUIT

CROSS-REFERENCE TO RELATED APPLICATION

This application claims the priority benefit of Taiwan application Ser. No. 87115640, filed Sep. 19, 1998, the full disclosure of which is incorporated herein by reference.

BACKGROUND OF THE INVENTION

1. Field of the Invention

This invention relates to semiconductor fabrication technology, and more particularly, to a semiconductor fabrication method for fabricating an isolation structure, including an STI (shallow-trench isolation) structure, in an integrated circuit (IC).

2. Description of Related Art

Device Isolation Technology is an important process in IC fabrication for electrically isolating the various active components in the IC. As integration becomes higher, isolation becomes more difficult. A conventional method for device isolation is the so-called Local Oxidation of Silicon (LOCOS) technique, which is used to provide field oxide layers to serve as isolation structures in the integrated circuit. One drawback to the LOCOS technique, however, is that the resulting isolation structure has a bird's beak shape that makes the further downsizing of the IC device difficult to realize. The STI (shallow trench isolation) technique serves as a solution to the drawback of the LOCOS technique, and which is now widely used in sub-half micron semiconductor fabrication.

A conventional method for fabricating an STI structure in an integrated circuit is illustratively depicted in the following with reference to FIGS. 1A–1E.

Referring first to FIG. 1A, in the initial step, a semiconductor substrate 10, such as a silicon substrate is prepared. A pad oxide layer 20 is then formed over the substrate 10. Next, a layer of silicon nitride 30 is formed over the pad oxide layer 20. After this, a photoresist layer 40 is coated over the silicon nitride layer 30 and then selectively removed to serve as an etching mask. Then, with the photoresist layer 40 serving as mask, an anisotropic etching process is performed to etch away the unmasked portions of the silicon nitride layer 30, the pad oxide layer 20, and the substrate 10 until reaching a predefined depth into the substrate 10, whereby a plurality of trenches 50 are formed in the substrate 10. After this, the photoresist layer 40 is removed.

Referring next to FIG. 1B, in the subsequent step, a thermal oxidation process is performed to cause the growth of a thin liner oxide layer 60 over all the exposed surfaces of the substrate 10 in the trenches 50, but not filling up the trenches 50. Next, an APCVD (atmospheric-pressure chemical-vapor deposition) process is performed to deposit silicon oxide into the trenches 50 and over the silicon nitride layer 30 to thereby form a silicon oxide layer 70. Then, a densification process is performed to densify the silicon oxide layer 70 by heating the wafer at a temperature of about 1,000° C. for a duration of from about 10 to 30 minutes.

Referring further to FIG. 1C, in the subsequent step, a CMP (chemical-mechanical polishing) process is performed on the silicon oxide layer 70 to remove an upper part of the silicon oxide layer 70 until exposing the silicon nitride layer 30. Through this process, only those portions of the silicon oxide layer 70 that lie in the trenches 50 (FIG. 1A) remain. These remaining portions of the silicon oxide layer 70 are herein and hereinafter designated by the reference numeral 80 and referred to as oxide plugs. One drawback to the use of the CMP process, however, is that the top surface of the oxide plugs 80 are slightly recessed to form a dished surface, as indicated by the reference numeral 90, due to the reason that the silicon oxide plugs 80 are less rigid than the silicon nitride layer 30.

Referring further to FIG. 1D, in the subsequent step, the silicon nitride layer 30 is entirely etched away by using a suitable etchant, such as hot phosphate solution. After this is done, the top surface of the pad oxide layer 20 is exposed and is lower than the top surface of the oxide plugs 80.

Referring further to FIG. 1E in the subsequent step, hydrofluoric acid (HF) is used as an etchant to etch away the entire pad oxide layer 20 and an upper part of the oxide plugs 80. Through this process, the top surface of the oxide plugs 80 is substantially leveled to the top surface of the substrate 10. The remaining oxide plugs 80 and the underlying liner oxide layer 60 in the trenches 50 (FIG. 1A) in combination constitute an STI structure. The resulting STI structure, however, is formed with undesirable recessed portions, as demonstratively illustrated and indicated by the reference numeral 100 in FIG. 1E. This is because the HF solution etches into the oxide plugs 80 more rapidly than into the pad oxide layer 20, and also the top surface of the oxide plugs 80 is higher than the top surface of the pad oxide layer 20, thus causing the edge part of the oxide plugs 80 to be overly etched and thereby form the recessed portions 100.

In practice, the foregoing conventional method has the following three major drawbacks. First, in the densification process to densify the silicon oxide layer 70, since the entire wafer, not just the silicon oxide layer 70, is subject to the high-temperature condition at about 1,000° C., the wafer surface may be warped due to the various component layers in the wafer having different thermal expansion coefficients (the thermal expansion coefficients of silicon nitride, silicon, and silicon oxide are respectively $3.5 \times 10^{-6}/°$ C. $2.6 \times 10^{-6}/°$ C., and $0.5 \times 10^{-6}/°$ C.). Therefore, during the heat treatment, the silicon nitride layer 30 expands more rapidly than and thus stresses the silicon substrate 10 and the silicon oxide layer 70. This may cause structural defects to the wafer, making the resultant IC device unreliable to use.

Second, in the CMP process subsequent to the densification process, since the silicon dioxide plug 80 is less rigid than the silicon nitride layer 30 and the polishing force is consistently applied on all surface parts of the wafer, the resulting oxide plugs 80 may be undesirably formed with the dished surface 90. Moreover, since the polishing force is typically set to suit the silicon nitride layer 30, it can scratch the surface of the oxide plugs 80; consequently, in the subsequent metallization process, some polysilicon can be left in the scratches in the surface of the oxide plugs 80, thus electrically bridging the insulating oxide plugs 80 to other components in the integrated circuit.

Third, the recessed portions 100 in the edges of the oxide plugs 80, if too deeply formed into the oxide plugs 80, may cause a kink effect in the subsequently formed transistors, thus deviating the subthreshold current of these transistors. This can make the transistors inoperable.

SUMMARY OF THE INVENTION

It is therefore an objective of the present invention to provide a method for fabricating an isolation structure, including an STI structure, in an integrated circuit, which is free from the above-mentioned three drawbacks of the prior art.

In accordance with the foregoing and other objectives of the present invention, a new method for fabricating an STI structure in an integrated circuit is provided. By the method of the invention, the first step is to prepare a semiconductor substrate, and then an adhesive layer a hard mask layer, and an etch-end layer are successively formed over the substrate. Next, a selective etching process is performed to etch away selected portions of the etch-end layer, the hard mask layer, and the adhesive layer, but not exposing the substrate, to thereby form a first opening and a second opening in the etch-end layer and the hard mask layer above the adhesive layer. The first opening is larger in dimension than the second opening. After this, a first sidewall spacer is formed on the sidewall of the first opening while a second sidewall spacer is formed on the sidewall of the second opening in such a manner that the adhesive layer at the bottom of the first opening that is uncovered by the first sidewall spacer is entirely removed to expose the underlying part of the substrate, while the adhesive layer at the bottom of the second sidewall spacer is still entirely covered by the second sidewall spacer. Subsequently, a first thermal oxidation process is performed to oxidize the exposed part of the substrate at the bottom of the first opening into a FOX layer. Then, an etching process is performed solely on the area defined by the second opening to etch successively through the second sidewall spacer and the part of the adhesive layer underlying the second sidewall spacer until reaching a predefined depth in the substrate to thereby form a trench in the substrate. A second thermal oxidation process is then performed to oxidize the exposed part of the substrate in the trench into a silicon dioxide plug which fills the trench entirely. Finally, the remaining etch-end layer, hard mask layer, adhesive layer, and first and second sidewall spacers are removed entirely. The silicon dioxide plug in the trench constitutes an STI structure and the STI structure and the FOX layer in combination constitute the intended isolation structure.

A characteristic of the invention is that the adhesive layer of the invention is thicker than that of the prior art. Another characteristic is that a thermal oxidation process is used to form the STI structure. The thick adhesive layer can help the various component layers in the integrated circuit increase their resistance to stress from thermal expansion. Moreover, the resulting STI structure is not be formed with recessed edge portions since the HF etchant acts on the silicon dioxide plug in the STI structure with substantially the same etching rate as on the adhesive layer. Moreover, the invention does not include a CMP process, so the problems caused by the CMP process in the case of the prior art can be prevented.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method of the invention for fabricating an isolation structure including an STI structure in an integrated circuit is disclosed in the following with reference to FIGS. 2A–2G.

Figure 1A:
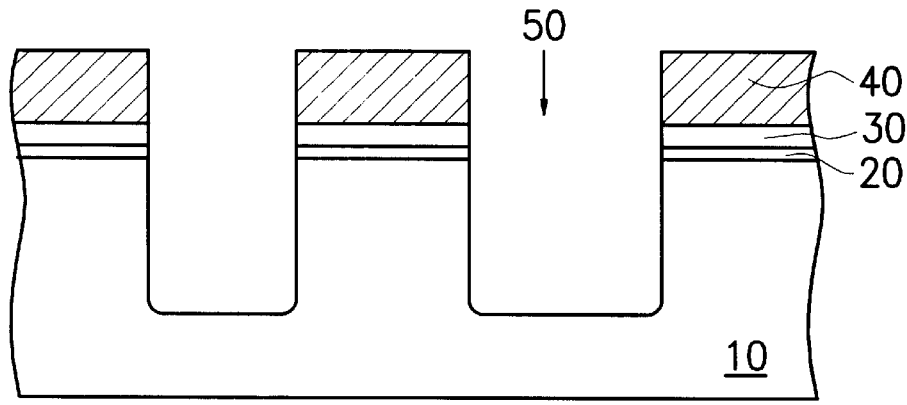
FIGS. 1A–1E are schematic, sectional diagrams used to depict the steps involved in a conventional method for fabricating an STI structure in an integrated circuit.
Figure 1B:
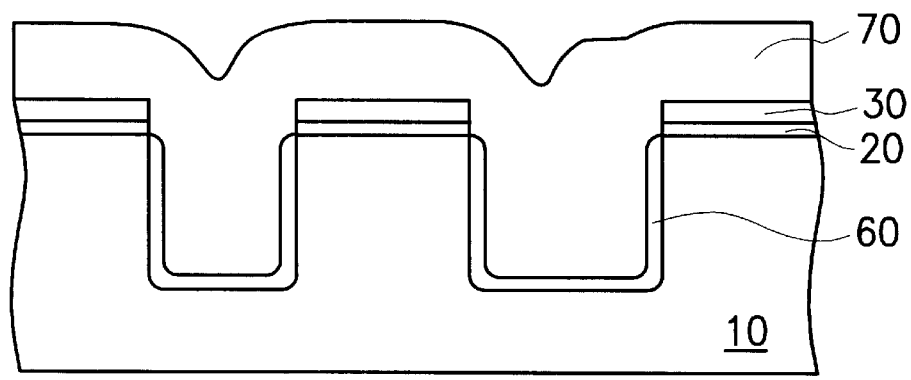
Figure 1C:
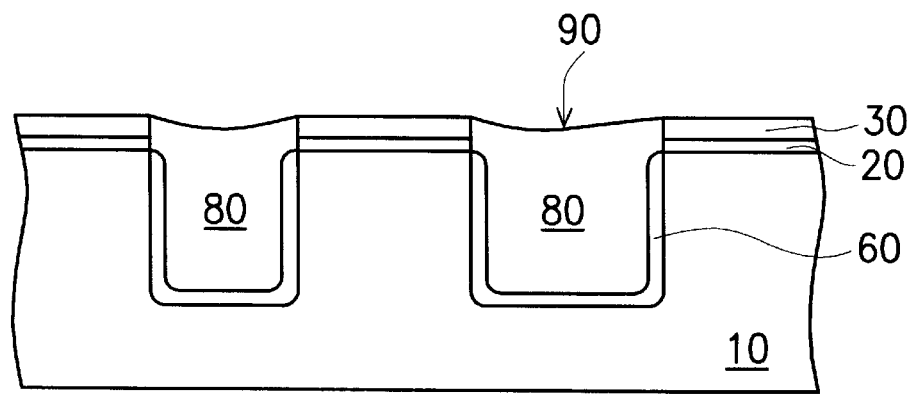
Figure 1D:
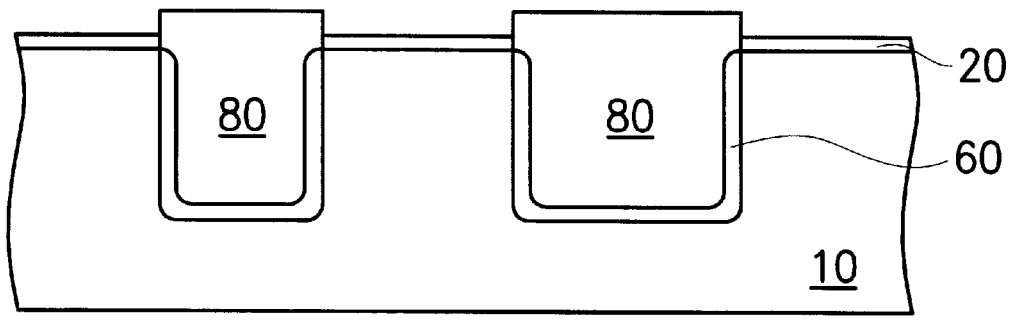
Figure 1E:
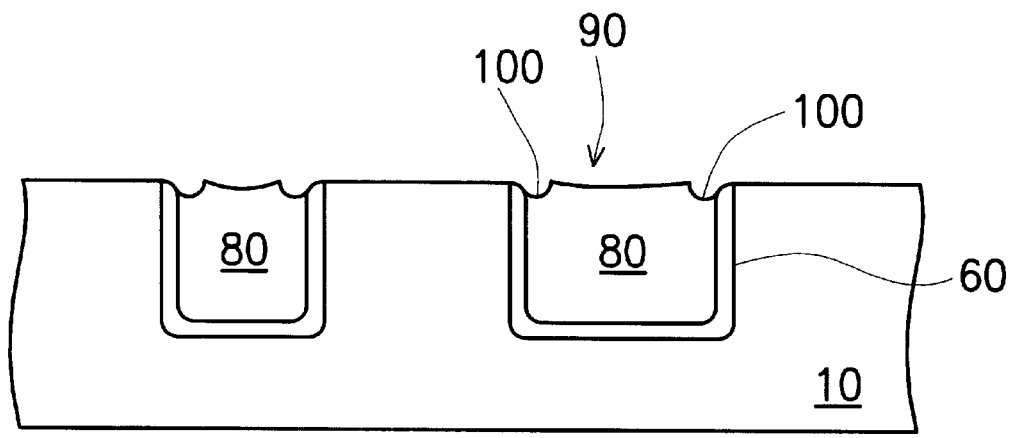
Figure 2A:
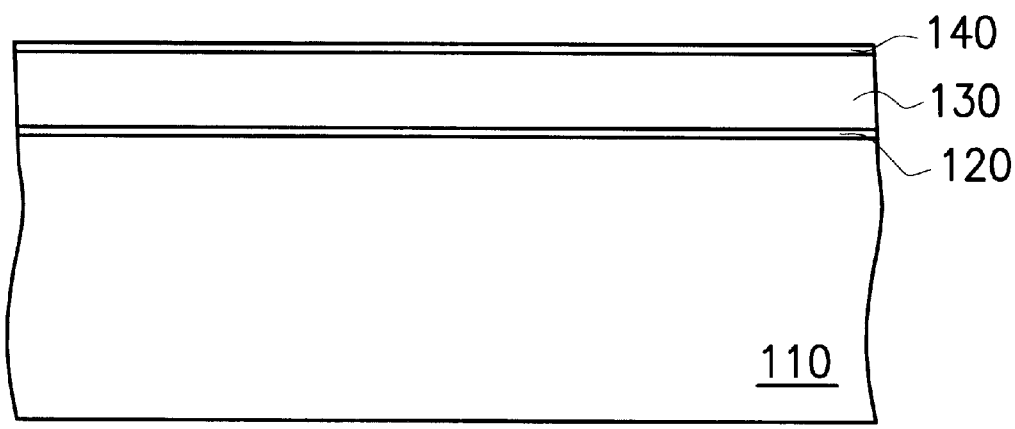
FIGS. 2A–2G are schematic, sectional diagrams used to depict the steps involved in the method of the invention for fabricating an STI structure in an integrated circuit.

Referring first to FIG. 2A, in the initial step, a semiconductor substrate 110, such as a silicon substrate, is prepared. An adhesive layer 120 is then formed, for example from a pad oxide layer of silicon oxide, through a thermal oxidation process at a temperature of about 900° C. to a thickness of from about 200 Å to 400 Å (angstrom). This adhesive layer 120 is used to help increase the bonding strength of the subsequently formed hard mask layer 130 to the substrate 110. The hard mask layer 130 is formed over the adhesive layer 120. preferably from silicon nitride, through an LPCVD (low-pressure chemical vapor deposition) process using a mixture of gaseous $Si_2Cl_2$ and $NH_3$ under a pressure of from about 0.1 Torr to 1.0 Torr as the deposition source and at a temperature of from 700° C. to 800° C. Next, an etch-end layer 140 is formed over the hard mask layer 130, preferably through an APCVD (atmospheric-pressure chemical-vapor deposition) process using gaseous tetra-ethyl-ortho-silicate (TEOS) under a pressure of from about 1.0 Torr to 10.0 Torr as the deposition source and performed at a temperature of from about 650° C. to 750° C.

Figure 2B:
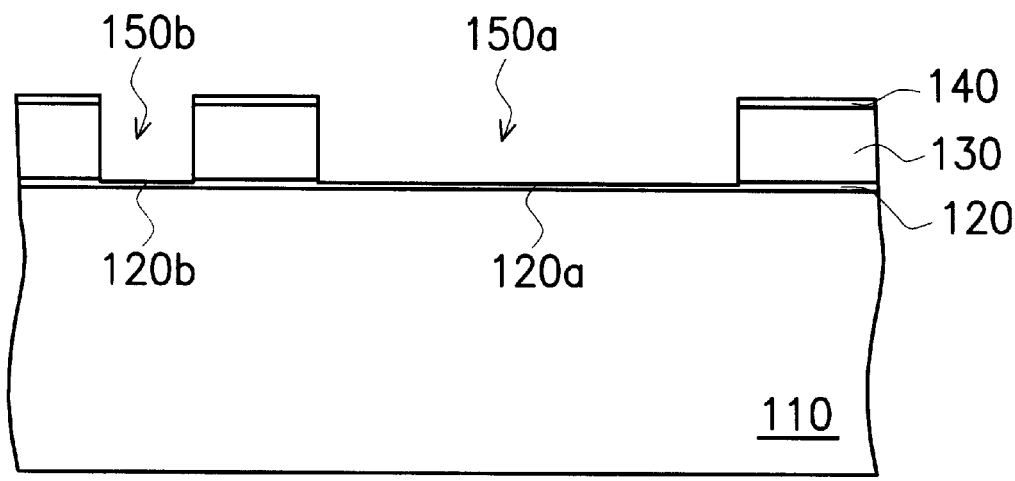

Referring next to FIG. 2B, in the subsequent step, a selective etching process, such as a photolithographic and etching process, is performed to etch away selected portions of the etch-end layer 140 and the hard mask layer 130 until reaching a predefined depth in the adhesive layer 120, whereby a first opening 150a and a second opening 150b are formed with the first opening 150a being larger in dimension than the second opening 150b. In this preferred embodiment, for example the second opening 150b is formed to isolate a MOS transistor in the integrated circuit, while the first opening 150a is formed to isolate the peripheral component of the MOS transistor. The remaining thickness of the adhesive layer 120 at the bottom of the first opening 150a is here designated by the reference numeral 120a, and that at the bottom of the second opening 150b is designated by the reference numeral 120b, and both are preferably about 100 Å.

Figure 2C:
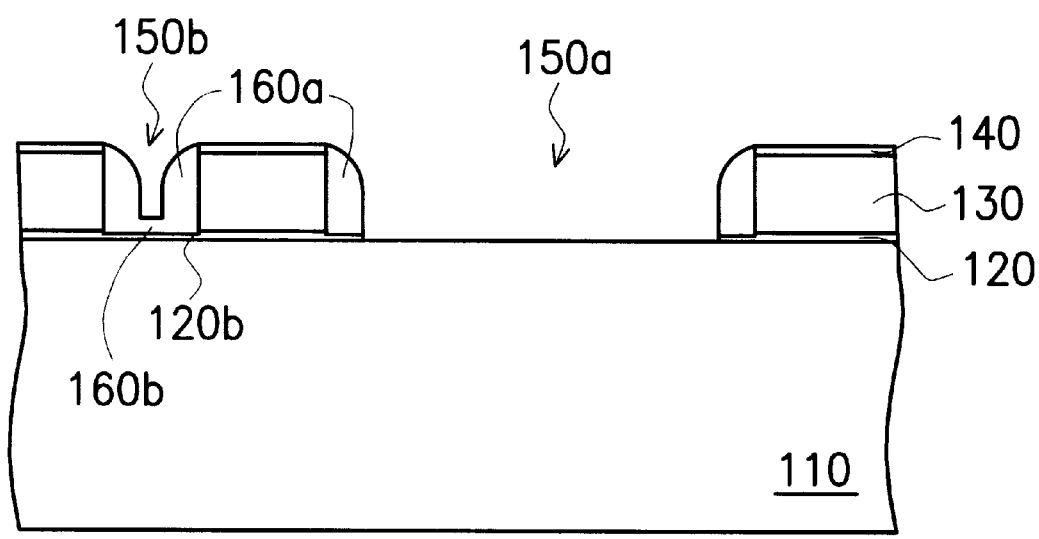

Referring further to FIG. 2C, in the subsequent step, a dielectric layer (not shown) is formed from, for example silicon nitride, in such a manner as to cover the entire top surface of the etch-end layer 140 and to fill entirely the first and second openings 150a, 150b. Next, an etching process is performed on this dielectric layer (not shown) until exposing all the top surfaces of the etch-end layer 140. The remaining part of the dielectric layer in the first opening 150a is here designated by the reference numeral 160a and is referred to as first sidewall spacer, while the remaining part of the second opening 150b is here designated by the reference numeral 160b and is referred to as second sidewall spacer. Since the first opening 150a is larger in dimension than the second opening 150b, the etching on the dielectric layer in the first opening 150a is faster in rate than on the dielectric layer in the second opening 150b. As a result, the bottom of the second opening 150b is still covered by the second sidewall spacer 160b, while the bottom of the second opening 150b is largely uncovered by the first sidewall spacer 160a, as demonstratively illustrated in FIG. 2C.

Figure 2D:
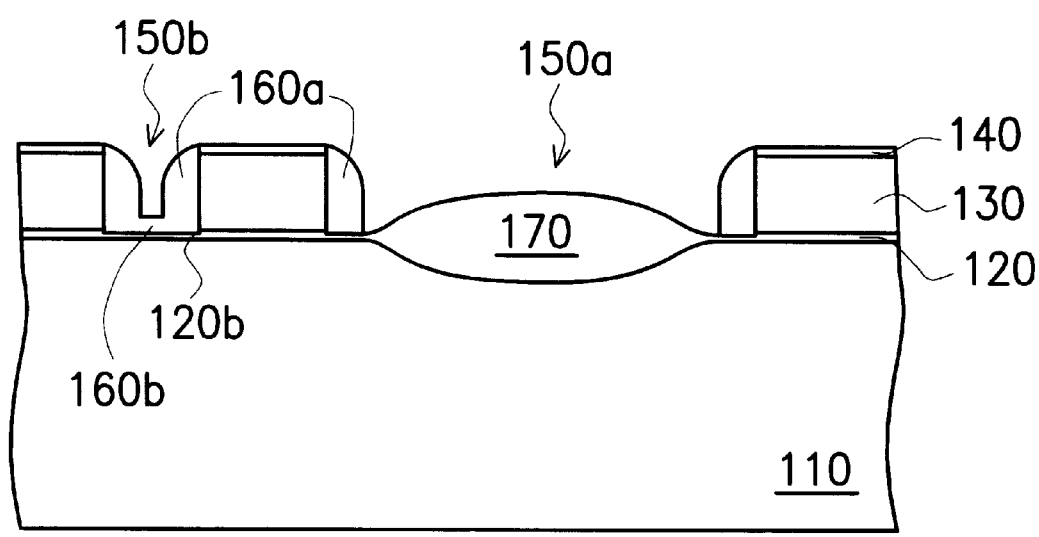

Referring further to FIG. 2D, in the subsequent step, a LOCOS (Local Oxidation of Silicon) process is performed on the wafer, whereby all the exposed part of the substrate 110 is oxidized to form a field oxide (FOX) layer 170. The FOX layer 170 is formed only at the bottom of the first opening 150a but not at the bottom of the second opening 150b since the bottom of the second opening 150b is entirely covered by the second sidewall spacer 160b.

Figure 2E:
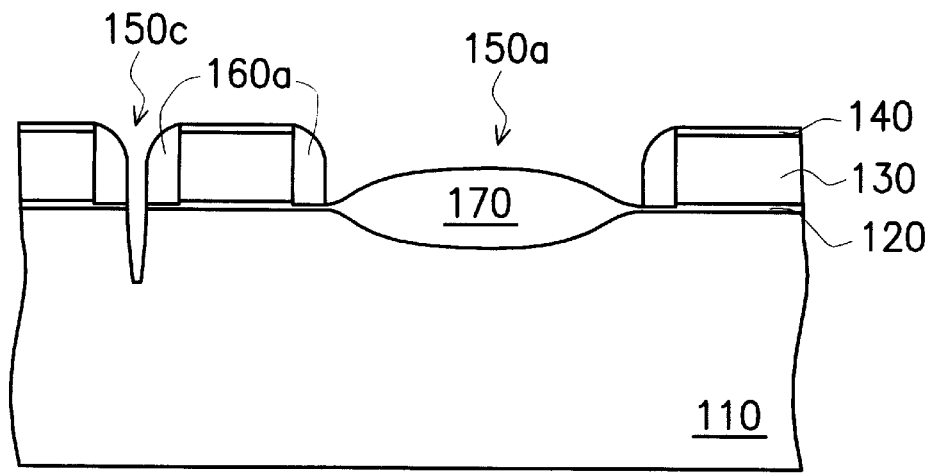

Referring further to FIG. 2E, in the subsequent step, an etching process is performed solely on the area defined by the second opening 150b so as to etch through the bottom part of the second sidewall spacer 160b and the underlying adhesive layer 120b until reaching a predefined depth into the substrate 110. Through this process, a shallow trench 150c is formed in the substrate 110.

Figure 2F:
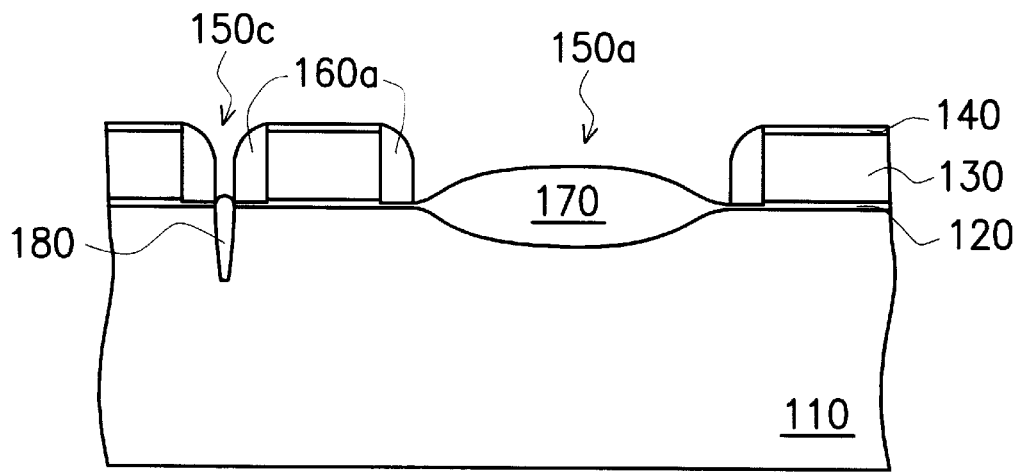

Referring to FIG. 2F, in the subsequent step a thermal oxidation process is performed at a temperature of about 900° C., whereby all the exposed part of the substrate 110 (i.e. the exposed surface in the shallow trench 150c) is oxidized into silicon dioxide until filling up the shallow trench 150c in the substrate 10. It is to be noted that the width of the shallow trench 150c should be less than about 0.1 µm (micrometer), preferably from 0.05 µm to 0.1 µm, otherwise, the silicon dioxide may be unable to fill the entire shallow trench 150c. Through this process, a silicon oxide plug 180 is formed in the substrate 10.

Figure 2G:
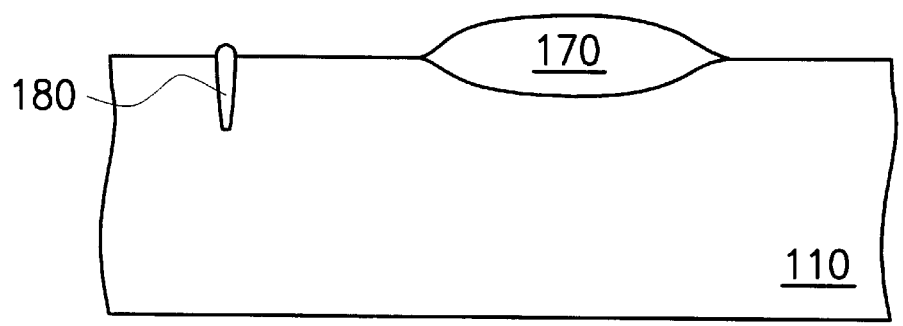

Referring next to FIG. 2G, in the subsequent step, all the remaining etch-end layer 140, the hard mask layer 130, the adhesive layer 120, and the first and second sidewall spacers 160a, 160b are entirely removed, leaving the FOX layer 170 and the silicon dioxide plug 180 in the substrate 110. The FOX layer 170 serves as a FOX isolation structure, while the silicon dioxide plug 180 serves as an STI structure.

It can be learned from the foregoing description that the method of the invention has the following advantages over the prior art.

(1) First, the method of the invention includes no CMP process to perform, thus preventing the undesired bridging effect in the silicon dioxide plug 180 of the resulting STI structure that otherwise occur in the case of the prior art due to the use of the CMP process.

(2) Second, the method of the invention does not include a no densification process, and instead, a thermal oxidation process is used to form the silicon dioxide plug 180 of the STI structure. Therefore, the invention can help prevent the warping of the wafer surface due to unequal thermal expansion coefficients of the various component layers in the wafer as in the case of the prior art.

(3) Third, the structure of the silicon oxide-based adhesive layer 120 between the silicon substrate 110 and the silicon nitride-based hard mask layer 130 allows the adhesive layer 120 to absorb the stresses from both the underlying silicon substrate 110 and the overlying hard mask layer 130 during heat treatment (the thermal expansion coefficients of are respectively $3.5 \times 10^{-6}/°$ C., $2.6 \times 10^{-6}/°$ C., and $0.5 \times 10^{-6}/°$ C.).

(4) Fourth, the method of the invention can help prevent the kink effect that otherwise occurs in the STI structure formed by the prior art. This is because the silicon dioxide plug 180 is formed through thermal oxidation, and thus is formed with a beak's beak shape protruding above the surface of the substrate 110.

(5) Fifth, the method of the invention can be used to form an STI structure with a width of less than about 0.1 µm, which is significantly less than 0.2 µm achieved by the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an isolation structure in an integrated circuit, comprising the steps of:

preparing a semiconductor substrate;

forming an adhesive layer over the substrate;

forming a hard mask layer over the adhesive layer;

forming an etch-end layer over the hard mask layer;

performing a selective etching process to etch away selected portions of the etch-end layer, the hard mask layer, and the adhesive layer but not exposing the substrate to thereby form a first opening and a second opening in the etch-end layer and the hard mask layer above the adhesive layer, wherein the first opening is larger in dimension than the second opening;

forming a first sidewall spacer on the sidewall of the first opening and a second sidewall spacer on the sidewall of the second opening, with the adhesive layer at the bottom of the first opening that is uncovered by the first sidewall spacer being entirely removed to expose the underlying part of the substrate, and with the adhesive layer at the bottom of the second sidewall spacer being entirely covered by the second sidewall spacer;

performing a first thermal oxidation process to oxidize the exposed part of the substrate at the bottom of the first opening into a FOX layer;

performing an etching process through the second opening to etch successively through the second sidewall spacer that covers the adhesive layer and the underlying adhesive layer until reaching a predefined depth into the substrate to thereby form a trench in the substrate, wherein the second sidewall spacer still remains to cover the second sidewall in order to define the trench narrow enough to be filled by thermal oxidation;

performing a second thermal oxidation process to oxidize the exposed part of the substrate in the trench into a silicon dioxide plug which fills the trench entirely; and entirely removing the remaining etch-end layer, hard mask layer, adhesive layer and first and second spacers; wherein the silicon dioxide plug in the trench constitutes an STI structure and the STI structure and the FOX layer in combination constitute the intended isolation structure.

2. The method of claim 1, wherein the adhesive layer is a pad oxide layer.

3. The method of claim 1, wherein the adhesive layer is formed to a thickness of from about 200 Å to 400 Å.

4. The method of claim 1, wherein the hard mask layer is formed from silicon nitride.

5. The method of claim 1, wherein, through the selective etching process, the remaining thickness of the part of the adhesive layer that lies at the bottom of the first and second openings is about 100 Å.

6. The method of claim 1, wherein the trench in the substrate is formed with a width of from about 0.05 µm to 0.1 µm.

* * * * *